(12) United States Patent
Pan

(10) Patent No.: US 8,716,897 B2
(45) Date of Patent: May 6, 2014

(54) VOLTAGE GENERATORS HAVING REDUCED OR ELIMINATED CROSS CURRENT

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 553 days.

(21) Appl. No.: 13/017,960

(22) Filed: Jan. 31, 2011

(65) Prior Publication Data

US 2012/0194160 A1  Aug. 2, 2012

(51) Int. Cl.
*H02J 1/00* (2006.01)
*H02J 3/00* (2006.01)
*H01H 83/00* (2006.01)
*B23K 11/24* (2006.01)
*H02J 7/00* (2006.01)

(52) U.S. Cl.
USPC ............ 307/87; 307/112; 307/116; 307/125; 323/284

(58) Field of Classification Search
None
See application file for complete search history.

(56) References Cited

U.S. PATENT DOCUMENTS

| | | | |
|---|---|---|---|
| 6,281,719 B1 | 8/2001 | Ho et al. | 327/108 |
| 6,545,923 B2 | 4/2003 | Sim et al. | 365/204 |
| 6,937,088 B2 | 8/2005 | Hamamoto et al. | 327/541 |
| 7,196,947 B2 | 3/2007 | Seitz | 365/189.11 |

*Primary Examiner* — Jared Fureman
*Assistant Examiner* — Aqeel Bukhari
(74) *Attorney, Agent, or Firm* — Dorsey & Whitney LLP

(57) ABSTRACT

Embodiments described include voltage generators having reduced or eliminated cross current. Dynamic adjustment of a low or high threshold voltage used in a voltage generator is described. Use of a folded cascade amplifier in a voltage generator is also described.

21 Claims, 5 Drawing Sheets

VOLTAGE GENERATORS HAVING REDUCED OR ELIMINATED CROSS CURRENT

TECHNICAL FIELD

Embodiments of the invention relate generally to voltage generators. The voltage generators may find use in electronic devices, such as memory devices.

BACKGROUND

Electronic devices may operate using one or more supply voltages applied to the device. In addition to applied supply voltages, electronic devices may generate additional voltages, such as by boosting or otherwise altering applied supply voltages.

Memory devices may generate a voltage that may have a value between a supply voltage and ground. The generated voltage may be used for any of a variety of purposes, including, but not limited to, being applied to one side of a capacitor used in a memory cell or being applied to a digit line used to address memory cells.

Voltages generated by electronic devices may be generated in a manner designed to reduce the variability of the generated voltage. FIG. 1 is a schematic illustration of a conventional voltage generator configured to generate a voltage VC2. The voltage generator 100 includes a pull down amplifier 105 and a pull up amplifier 110. The pull down amplifier 105 receives the generated voltage VC2 at a first input and a high threshold voltage ('High') at a second input. The pull down amplifier 105 has an output coupled to the gate of a transistor 115. The pull up amplifier 110 receives the generated voltage VC2 at a first input and a low threshold voltage ('Low') at a second input. The pull up amplifier 110 has an output coupled to the gate of a transistor 120. The transistor 120 is a p-FET transistor coupled between a supply voltage VCCX and the generated voltage VC2. The transistor 115 is an n-FET transistor coupled between the generated voltage VC2 and a ground reference voltage. The generated voltage VC2 is accordingly generated at the drains of the transistors 120 and 115.

The voltage generator 100 accordingly ensures that the generated voltage VC2 is maintained between the High and Low threshold voltages. If the voltage VC2 falls below the low threshold voltage Low, the pull up amplifier 110 is configured to turn on the transistor 120 to pull VC2 up to the low threshold voltage. If the voltage VC2 rises above the high threshold voltage High, the pull down amplifier 105 is configured to turn on the transistor 115 to pull VC2 down to the high threshold voltage. The voltage VC2 may, however, vary between the high and low threshold voltage values. The range between the high and low threshold voltage values may be referred to as 'dead band.'

The high and low threshold voltage values may be generated in any of a variety of ways. FIG. 2 is a schematic illustration of a circuit for generating the high and low threshold voltages ('High' and 'Low') of FIG. 1. A resistor divider 200 includes resistor 205, variable resistor 210, and resistor 215. The resistors 205, 210, and 215 are coupled in series between supply voltages Vcc and ground. The values of High and Low may be determined by setting or varying the value of the variable resistor 210.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 1:
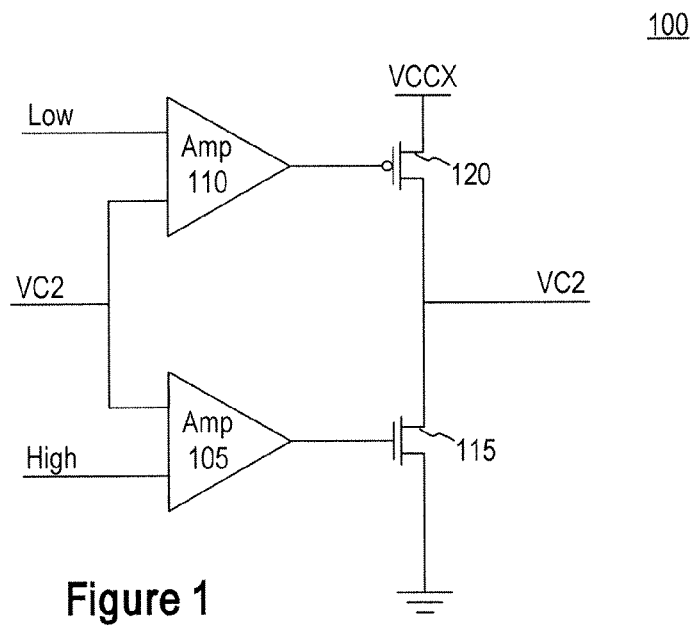
FIG. 1 is a schematic illustration of a conventional voltage generator configured to generate a voltage VC2.
Figure 2:
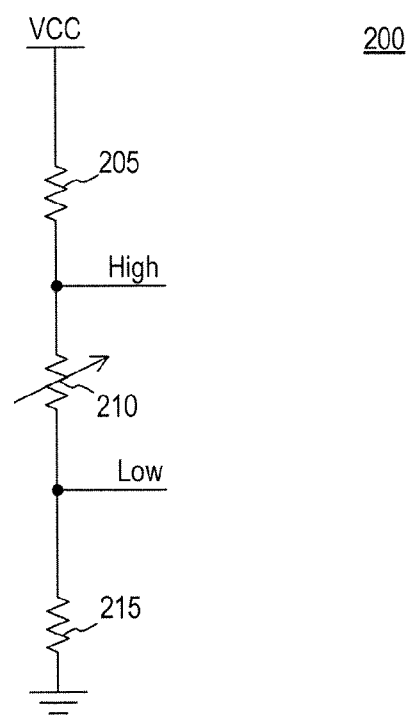
FIG. 2 is a schematic illustration of a circuit for generating the high and low threshold voltages of FIG. 1.

A conventional manner of generating a voltage in an electronic device has been described above with reference to FIGS. 1 and 2. However, the conventional manner may experience undesirable cross current. Referring to FIG. 1, cross current may be generated and run from the power supply Vccx to ground when both the transistors 120 and 115 are turned on. As has been described above, the transistors 120 and 115 are generally not configured to be turned on at the same time. Generally, as was described above, the transistor 120 is configured to turn on when the voltage VC2 falls below the low threshold voltage, while the transistor 115 is off. The transistor 115 is designed to be turned on when the voltage VC2 increases above the high threshold voltage, while the transistor 120 is off. However, due to mismatches introduced offset or other non-idealities in the amplifiers 110 and 105, the transistors 120 and 115 in practice may sometimes be on simultaneously. During those times, cross current is generated from Vccx to ground, through both the transistors 120 and 115, which may be undesirable and consume excess power. As transistor dimensions continue to shrink, the problem of mismatch and cross current may increase. Further, bias currents used to operate amplifiers such as the amplifiers 105 and 110 of FIG. 1 have been increasing to improve performance of the amplifier, such as to improve the speed of the amplifier. The use of higher bias current may also worsen the problem of cross current generation, as the cross current generated would also be higher.

Embodiments described below include voltage generators having reduced or eliminated cross current relative to a conventional voltage generator such as the one described above with reference to FIGS. 1 and 2. While reduced or eliminated cross current may be an advantage of some embodiments described below, it is to be understood that not all embodiments may exhibit this advantage. The drawbacks of the conventional voltage generator described above, and the identification of advantages of some embodiments are described herein for ease of understanding, and are not intended to limit any of the described embodiments.

Figure 3:
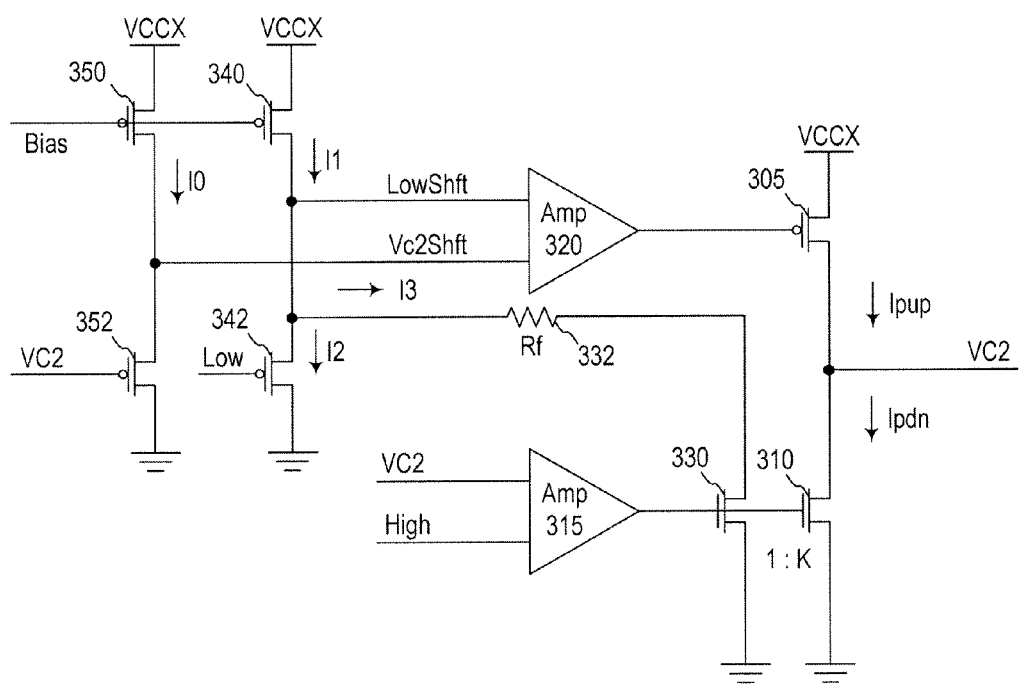
FIG. 3 is a schematic illustration of a voltage generator in accordance with an embodiment of the present invention.

Embodiments of the present invention include voltage generators having a dynamically varying dead band. FIG. 3 is a schematic illustration of a voltage generator 300 in accordance with an embodiment of the present invention. The voltage generator 300 generates a voltage VC2 at an output node, which in FIG. 3 corresponds to the drains of transistors 305 and 310. The transistor 305 is a p-FET transistor, while the transistor 310 is an n-FET transistor. The transistors 305 and 310 are coupled together at their drains between two supplies—Vccx and ground as shown in FIG. 3. Current through the transistor 305 is labeled Ipup in FIG. 3, while current through the transistor 310 is labeled Ipdn. A pulldown amplifier 315 has an output coupled to the gate of the transistor 310. The amplifier 315 is provided with a feedback voltage corresponding to VC2 at one input and a high threshold voltage, High, at a second input. The amplifier 315 is configured to turn on the transistor 310 if the feedback voltage VC2 rises higher than the high threshold voltage such that the output voltage VC2 is pulled down to the high threshold voltage. The operation of the pulldown amplifier 315 is therefore similar to the operation of the amplifier 105 described above with reference to FIG. 1.

Referring back to FIG. 3, a pullup amplifier 320 is also provided, having an output coupled to the gate of the transistor 305. Rather than comparing VC2 and a low threshold voltage, as was the case in FIG. 1, however, the amplifier 320 is configured to make a comparison with a dynamic low threshold voltage 'LowShft'. As will be described, the dynamic low threshold voltage may change based on the current passed through the transistor 310. The voltage VC2, or a shifted version of the voltage VC2 as will be described further below, is input into the pullup amplifier 320. The pullup amplifier 320 also receives the dynamic low threshold voltage LowShft at a second input. The pullup amplifier 320 is configured to turn on the transistor 305 when the voltage VC2, or a shifted version of the voltage VC2, falls below the LowShft voltage.

The LowShft voltage is generated based on the current passed through the transistor 310, labeled Ipdn in FIG. 3. As Ipdn increases, the LowShft voltage is configured to decrease. Accordingly, when the transistor 310 is turned on, generating current Ipdn, and generally indicating the voltage VC2 is above the high threshold voltage 'High', the LowShft voltage may decrease, making it less likely that the amplifier 320 will activate to turn on the transistor 305. Therefore it may be less likely that both the transistors 305 and 310 are turned on simultaneously, reducing or eliminating cross current.

Many circuitry configurations may be used to generate a dynamic low threshold voltage LowShft, and one such configuration is shown in FIG. 3. A transistor 330 has a gate coupled to the output of the pulldown amplifier 315 and the gate of the transistor 310. The transistor 330 may be sized differently than the transistor 310, with a 1:K ratio shown in FIG. 3. In particular, the transistor 330 may have a smaller dimension than the transistor 310, such as a smaller channel dimension. The source of the transistor 330 is coupled to ground while the drain of the transistor 330 is coupled to a feedback resistor 332. The feedback resistor 332 is coupled to the input of the pullup amplifier 320 configured to receive the LowShft threshold voltage. In this manner, when the amplifier 315 turns on the transistor 310, the transistor 330 may also be turned on, generating a current flow labeled I3 through the feedback resistor 332.

The drain of the transistor 330, coupled to the LowShft input of the amplifier 320, is also coupled to the drains of the transistors 340 and 342. The sources of the transistors 340 and 342 are coupled to Vccx and ground, respectively. A bias may be applied to the gate of the transistor 340, generating a current I1 through the transistor 340. A low threshold voltage 'Low' may be applied to the gate of the transistor 342, generating a current I2 through the transistor 342. As the current I3 increases when the transistor 330 is turned on, the current I2 may decrease, as the current I1 has not changed and I1=I2+I3. The decreasing current I2 may in turn cause the voltage Vc2Shft to decrease, decreasing the threshold against which the VC2 voltage is compared to turn on the amplifier 320, and making it less likely the amplifier 320 will turn the transistor 305 on during a same time the transistor 310 is on.

During times when the amplifier 330 does not turn the transistor 310 on, the transistor 330 may also not be on. Accordingly, no current may be generated through the feedback resistor 332. The amplifier 320 may then operate in an analogous manner to the amplifier 110 of FIG. 1, comparing the voltage VC2 to a low threshold voltage. However, note that the low threshold voltage is now applied to the gate of the transistor 342, instead of the input of the amplifier 320. When the current I3 is substantially 0, the voltage at the input of the amplifier 320 will be LowShft, where LowShft is equal to the low threshold voltage Low plus the gate-source voltage of the transistor 342. That is, the low threshold voltage provided to the amplifier 320 is shifted by $V_{gs}$ of the transistor 342. Accordingly, the VC2 voltage may be shifted a similar amount to maintain an accurate comparison. the transistors 350 and 352 may be provided for this purpose. The drain of the transistor 350 and the source of transistor 352 may be coupled together and to another input of the amplifier 320. The drain of the transistor 350 is coupled to the supply Vccx, and the gate of the transistor 350 coupled to the gate of the transistor 340 and a bias. The source of the transistor 352 is coupled to ground and the gate of the transistor 352 may receive the VC2 voltage from the output of the voltage generator 300. The transistors 350 and 352 may have similar device properties to those of 340 and 342, respectively. Accordingly, the feedback voltage provided to the input of the amplifier, Vc2Shft, may be equal to VC2 plus a gate-source voltage of the transistor 352. That is, the VC2 voltage may be shifted a same amount as the low threshold voltage.

The 'High' and 'Low' threshold voltages may be generated in any suitable manner, including the use of a resistor divider as shown above with reference to FIG. 2.

As has been described above with reference to FIG. 3, in some embodiments a low threshold voltage for comparison with the voltage generator output voltage may be dynamically adjusted lower during times when a pulldown amplifier has turned on a transistor to pull the output voltage down. In other embodiments, the high threshold voltage may be dynamically adjusted higher during times when a pullup amplifier has turned on a transistor to pull the output voltage up.

Figure 4:
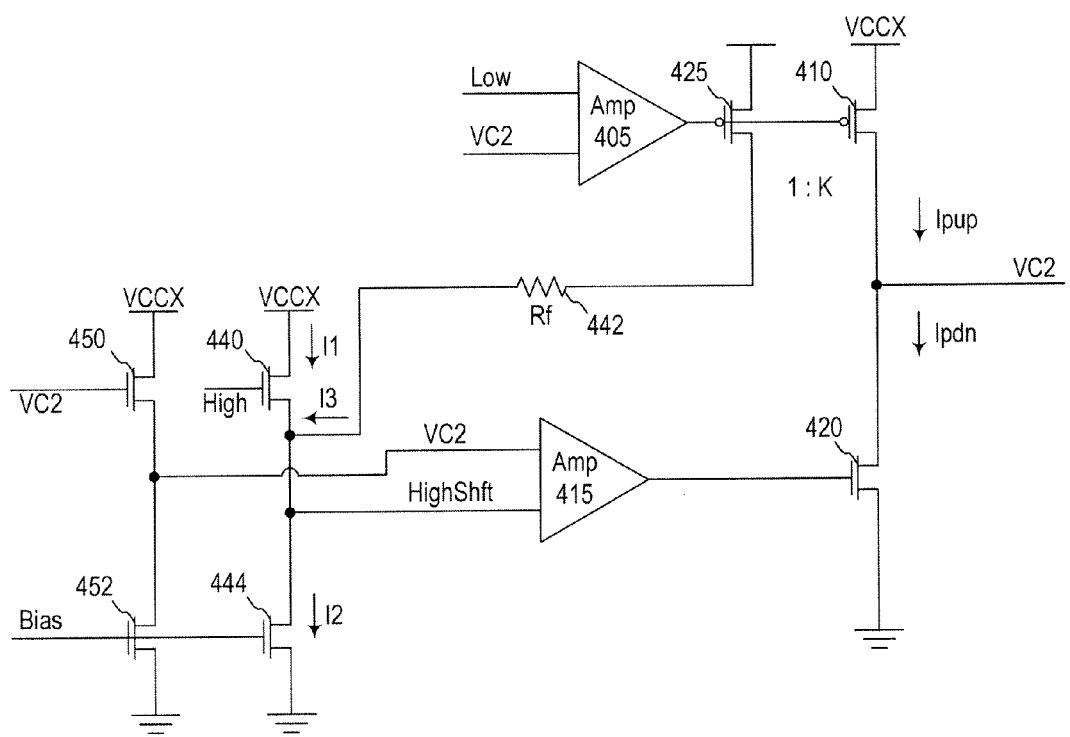
FIG. 4 is a schematic illustration of another voltage generator in accordance with an embodiment of the present invention.

FIG. 4 is a schematic illustration of another voltage generator in accordance with an embodiment of the present invention. The embodiment shown in FIG. 4 is configured to dynamically increase a high threshold voltage provided to a pulldown amplifier during a time a pullup amplifier is activating a transistor to raise the output voltage. The pullup amplifier 405 of FIG. 4 is configured to activate the transistor 410 when the feedback voltage VC2 falls below a low threshold voltage 'Low'. Turning the transistor 410 on generates a current Ipup and pulls the voltage VC2 up to the low threshold voltage.

Pulldown amplifier 415 is coupled to the transistor 420, and configured to turn on the transistor 420 when a feedback voltage, which may be a shifted version of the voltage VC2, has exceeded the dynamic high threshold voltage HighShft. A transistor 425 has a gate coupled to the output of the pullup amplifier 405 and the gate of the transistor 410. Accordingly, when the pullup amplifier 405 turns on the transistor 410, it may also turn on the transistor 425, generating a current I3 through the transistor 425. The transistor 425 may be scaled smaller than the transistor 410, with a 1:K ratio shown in FIG. 4.

The current I3 is coupled to a source of a transistor 440 through a feedback resistor 442. The high threshold voltage 'High' may be provided to the gate of the transistor 440. The transistor 440 may generate an amount of current I1 as shown. The transistor 440 may be coupled to a transistor 444 having a bias provided to its gate. Accordingly, the transistor 444 may provide an amount of current I2. Since I2=I1+I3, as the current I3 rises, and I2 stays the same, the current I1 may decrease, causing an increase in the voltage at the source node—the voltage 'HighShft'. Accordingly, when the transistor 410 is turned on, the high threshold voltage applied to the pulldown amplifier 415 may be increased.

In an analogous manner described above with reference to FIG. 3, it may be desirable to also shift the output VC2 voltage to generate the feedback voltage provided to the pulldown amplifier 415. Accordingly, the transistors 450 and 452 are provided. The transistor 450 receives the output VC2 voltage at its gate, and the feedback voltage VC2Shft is provided at the source of the transistor 450. The transistor 452 receives the bias at its gate, which is also coupled to the gate of the transistor 444. In this manner, when the transistor 410 is not turned on, and therefore substantially no current is passed through the feedback resistor 442, both the High threshold voltage and the VC2 voltage are shifted by $V_{gs}$ of the transistors 440 and 450 before being provided to the amplifier 415 for comparison.

The 'High' and 'Low' threshold voltages described above may be generated in any suitable manner, including the use of a resistor divider as shown above with reference to FIG. 2.

Embodiments described above may reduce or eliminate cross current in a voltage generator by dynamically increasing the dead band of the voltage generator—the difference between the high and low threshold voltages. In other embodiments of the present invention, operation of one or more amplifiers in the voltage generator may be modified to reduce or eliminate cross current.

Figure 5:
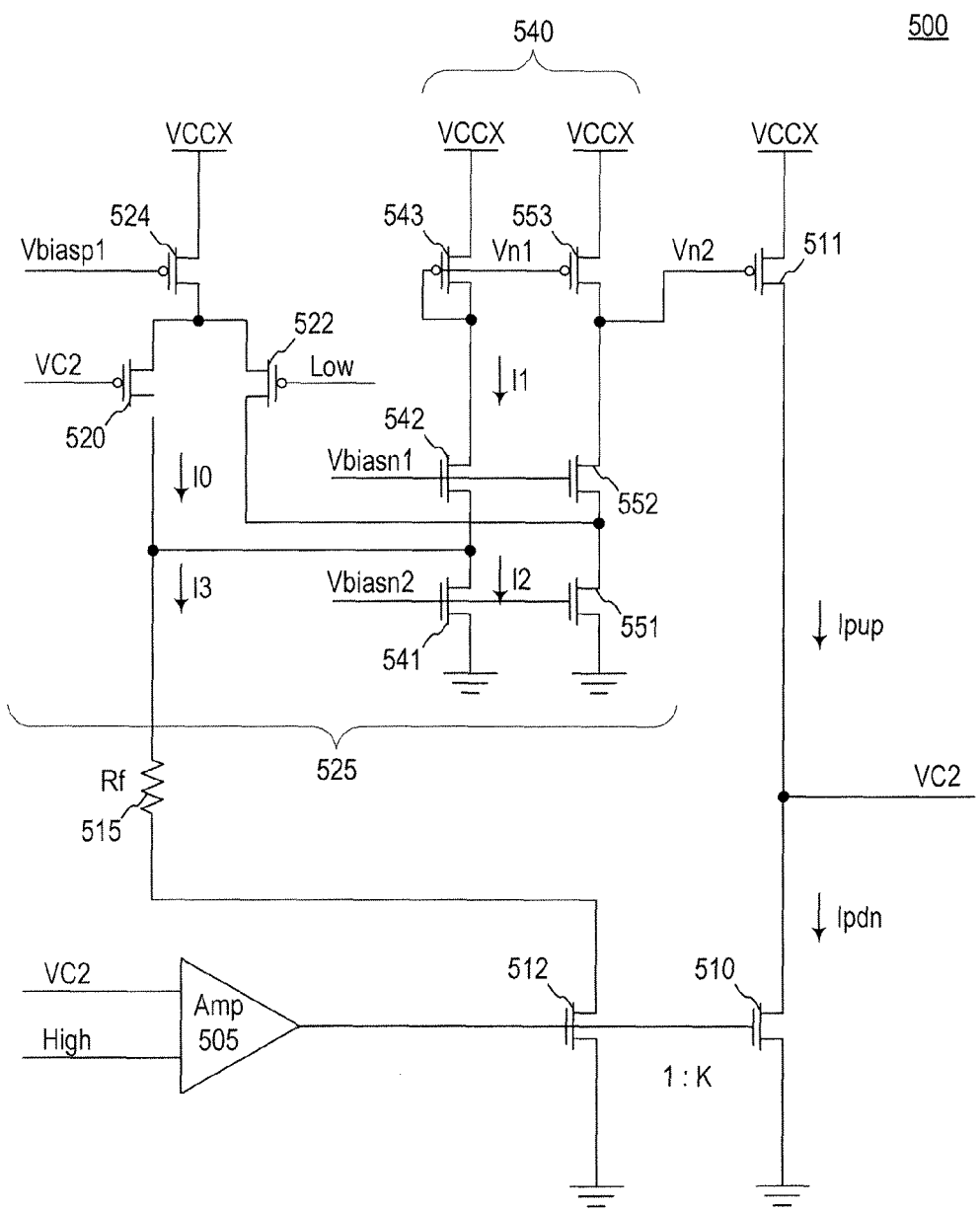
FIG. 5 is a schematic illustration of another voltage generator according to an embodiment of the present invention.

FIG. 5 is a schematic illustration of another voltage generator 500 according to an embodiment of the present invention. The voltage generator 500 includes a pulldown amplifier 505 similar to the operation of the pulldown amplifiers described above. The pulldown amplifier 505 receives a high threshold voltage 'High' at one input and a feedback voltage VC2 at another input. The pulldown amplifier 505 had an output coupled to the gate of the transistor 512 and the gate of the transistor 510. When the feedback voltage VC2 increases above the high threshold voltage, the pulldown amplifier 505 turns on the transistor 510 to pull the output voltage VC2 down to the high threshold voltage. The transistor 512, which may be smaller than the transistor 510, is also turned on to generate a current I3 through a feedback resistor 515.

The pullup and pulldown amplifiers described above have been implemented with differential operational amplifiers. Rather than utilize two differential amplifiers, the voltage generator 500 implements a pullup amplifier using a folded cascade topology. In particular, a differential pair of transistors 520, 522 are provided as a first stage of the folded cascade amplifier 525. The transistor 520 receives a feedback voltage VC2 at its gate, while the transistor 522 receives a low threshold voltage at its gate. The transistors 520, 522 may be biased by the transistor 524 coupled to the sources of the transistors 520 and 522 and provided with a bias, Vbiasp1, at its gate. The bias, Vbiasp1, turns the transistor 524 on to provide current to the differential pair of transistors 520 and 522. Based on the difference between the feedback voltage VC2 and the threshold voltage Low, different amounts of current may be passed through the transistors 520 and 522.

The drains of the transistors 520 and 522 are coupled to respective legs of a cascade stage 540. Each leg of the cascade stage includes two bias transistors. The transistors 541, 542 are in the first leg and the transistors 551, 552 are in the second leg. The gates of the transistors 541 and 551 are coupled together and configured to receive a bias Vbiasn2. The gates of the transistors 542 and 552 are coupled together and configured to receive a bias Vbiasn1. The drain of the transistor 520 is coupled between the transistors 541 and 542, while the drain of the transistor 522 is coupled between the transistors 551 and 552. In this manner, current through the transistor 520, which depends in turn on the feedback voltage VC2, may be provided to the first leg of the cascade stage 540. Current through the transistor 522, which depends in turn on the low threshold voltage Low, may be provided to the second leg of the cascade stage 540. A transistor 543 has a drain coupled to the source of the transistor 542. The gate of the transistor 543 is coupled to the drain, such that the current I1 may set the gate voltage. The gate of the transistor 543 is coupled to the gate of a transistor 553 in the second leg of the cascade stage. The gate voltage and the current through the transistor 553 may set the voltage at the output of the cascade stage, Vn2. The circuit is configured such that Vn2 may turn on the transistor 511 when the feedback voltage VC2 is less than the low threshold voltage Low, to pull the output voltage VC2 up to the low threshold voltage.

When the transistor 510 is turned on, however, current I3 may flow through the resistor 515. This may increase the amount of current drawn through the transistor 543. As shown in FIG. 5, I1=I2+I3−I0, where I1 is a current through the transistor 543, I2 is a current through the transistor 541, I3 is a current through the feedback resistor 515, and I0 is a current through the transistor 520. Since I0 and I2 generally may not change as I3 changes, when I3 increases, I1 may also increase. An increased I1 current is analogous effect to increasing the feedback voltage VC2. Increasing I1 may lower the voltage Vn1 at the gates of the transistors 543 and 553. The lowered Vn1 voltage may accordingly raise the voltage Vn2 at the drain of the transistor 553 and gate of the transistor 511. Raising Vn2 reduces the current through 511. Accordingly, increasing the current through the feedback resistor makes is less likely that the folded cascade amplifier will turn on the transistor 511 during a time when the transistor 510 is on. As has been described above, this may reduce or eliminate cross current.

The value of the feedback resistor 515 may be selected such that the amplifier remains stable. If the feedback resistor 515 is too small, the current I3 may be large and dominate I1 such that the pullup amplifier 525 fails to operate properly. Accordingly, the feedback resistor 515 may be selected to be sufficiently large that the pullup amplifier 525 maintains proper operation.

While the use of a folded cascade amplifier has been described above to implement a pullup amplifier, in other embodiments, a folded cascade amplifier may be used to implement a pulldown amplifier.

While the generation of a positive VC2 voltage has been described above, it is to be understood that other embodiments of the present invention may generate a negative VC2 voltage.

Figure 6:
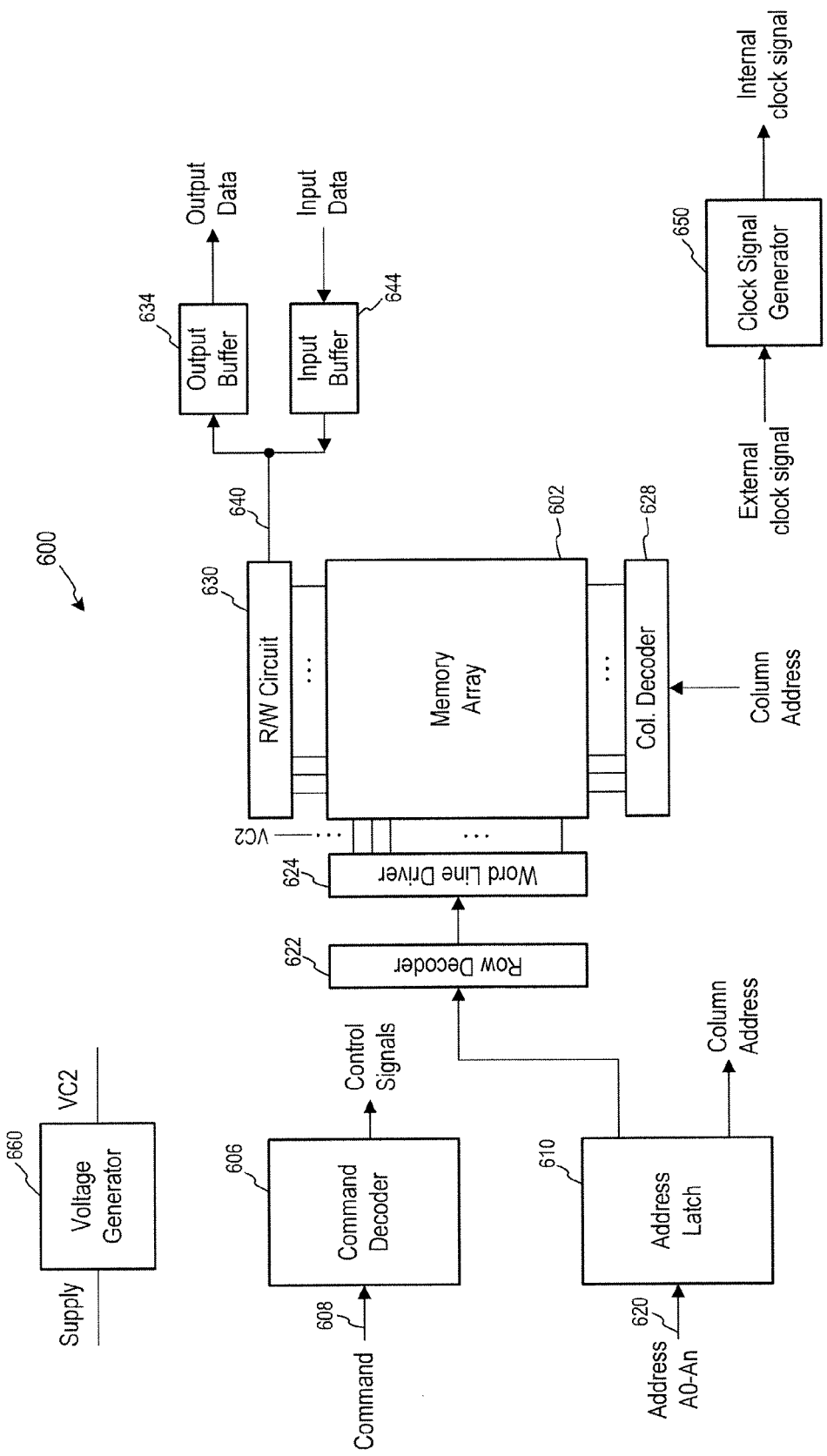
FIG. 6 is a schematic illustration of a portion of a memory according to an embodiment of the present invention.

FIG. 6 is a schematic illustration of a portion of a memory 600 according to an embodiment of the present invention. The memory 600 includes an array 602 of memory cells, which may be, for example, DRAM memory cells, SRAM memory cells, flash memory cells, or some other type of memory cells. The memory cells may be arranged in rows and columns, or in any other arrangement. The memory system 600 includes a command decoder 606 that receives memory commands through a command bus 608 and generates corresponding control signals within the memory 600 to carry out various memory operations. The command decoder 606 responds to memory commands applied to the command bus 608 to perform various operations on the memory array 602. For example, the command decoder 606 is used to generate internal control signals to read data from and write data to the memory array 602. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630.

A clock signal generator 650 is configured to receive an external clock signal and generate a synchronized internal clock. The clock signal generator 650 may include, for example, a DLL or PLL. The clock signal generator 650 may receive an external clock signal applied to the memory system 600 and may generate a synchronized internal clock signal which may be supplied to the command decoder 606, address latch 610, and/or input buffer 644 to facilitate the latching of command, address, and data signals in accordance with the external clock.

A voltage generator 660 is configured to receive a supply and generate a voltage VC2. The voltage generator 660 may be implemented using embodiments of the present invention, such as by using one or more of the voltage generators 300, 400, 500, or 600 described above. The supply voltage may be, for example, Vccx. The generated VC2 voltage may be provided to various portions of the memory 600. For example, the VC2 voltage may be provided to one or more cells of the memory array 602. The VC2 voltage may be applied to a plate of a capacitor in the memory cell to improve the performance of the memory cell. For example, the VC2 voltage may be ½ of a supply voltage Vcc or lower in some embodiments. By applying the VC2 voltage on one side of the capacitor, while the other side is coupled to a supply, such as ground or Vcc, voltage drift on the capacitor may be reduced. The VC2 voltage may instead or additionally be provided to digitlines, such as word lines coupled to the word line driver 624.

The memory shown in FIG. 6 may be implemented in any of a variety of products employing processors and memory including for example cameras, phones, wireless devices, displays, chip sets, set top boxes, gaming systems, vehicles, and appliances. Resulting devices employing the memory system may benefit from the embodiments voltage generators described above to perform their ultimate user function.

From the foregoing it will be appreciated that, although specific embodiments of the invention have been described herein for purposes of illustration, various modifications may be made without deviating from the spirit and scope of the invention.

What is claimed is:

1. A voltage generator comprising:
a first transistor coupled between a first supply and an output node;
a second transistor coupled between a second supply and the output node;
a first amplifier having an output coupled to a gate of the first transistor, a first input configured to receive a feedback voltage based, at least in part, on a voltage at the output node, and a second input configured to receive a low threshold voltage, wherein the first amplifier is configured to turn on the first transistor when the feedback voltage is lower than the low threshold voltage;
a second amplifier having an output coupled to a gate of the second transistor, a first input configured to receive a feedback voltage based, at least in part, on the voltage at the output node, and a second input configured to receive a high threshold voltage, wherein the second amplifier is configured to turn on the second transistor when the feedback voltage is higher than the high threshold voltage; and
circuitry coupled to the first or second amplifier and configured to either:
dynamically adjust the low threshold voltage during at least a portion of time the second transistor is on; or
dynamically adjust the high threshold voltage during at least a portion of time the first transistor is on.

2. The voltage generator of claim 1, wherein the first amplifier comprises a pullup amplifier configured to pull a voltage at the output node up to the low threshold voltage.

3. The voltage generator of claim 1, wherein the second amplifier comprises a pulldown amplifier configured to pull a voltage at the output node down to the high threshold voltage.

4. The voltage generator of claim 1, wherein the circuitry coupled to the first or second amplifier is configured to dynamically adjust the low or high threshold voltage, based, at least in part, on a current through the first or second transistor, respectively.

5. The voltage generator of claim 1, wherein the circuitry is coupled to the first amplifier and configured to dynamically adjust the low threshold voltage during at last a portion of time the second transistor is on.

6. The voltage generator of claim 5, wherein the circuitry is configured to decrease the low threshold voltage responsive to increasing current through the second transistor.

7. The voltage generator of claim 5, wherein the circuitry comprises a third transistor having a gate coupled to the output of the second amplifier and the gate of the second transistor, wherein the third transistor has a smaller dimension than the second transistor.

8. The voltage generator of claim 7, wherein the circuitry comprises a feedback resistor coupled between the third transistor and the second input of the first amplifier.

9. The voltage generator of claim 8, wherein the circuitry further comprises:
a fourth transistor coupled to the second input of the first amplifier, wherein the fourth transistor is configured to receive a bias at its gate to turn the fourth transistor on; and
a fifth transistor coupled to the second input of the first amplifier, wherein the fifth transistor is configured to receive an initial low threshold voltage at its gate, and wherein current through the fifth transistor is configured to vary responsive to changes in current through the third transistor and feedback resistor.

10. The voltage generator of claim 9, further comprising circuitry configured to generate the feedback voltage comprising:
a sixth transistor coupled to the first input of the second amplifier, wherein the sixth transistor is configured to receive the voltage at the output node and generate the feedback voltage at a source or drain of the sixth transistor.

11. The voltage generator of claim 1, wherein the circuitry is coupled to the second amplifier and configured to dynamically adjust the high threshold voltage during at last a portion of time the first transistor is on.

12. The voltage generator of claim 11, wherein the circuitry is configured to increase the high threshold voltage responsive to increasing current through the first transistor.

13. The voltage generator of claim 11, wherein the circuitry comprises a third transistor having a gate coupled to the output of the first amplifier and the gate of the first transistor, wherein the third transistor has a smaller dimension than the first transistor.

14. The voltage generator of claim 13, wherein the circuitry comprises a feedback resistor coupled between the third transistor and the second input of the second amplifier.

15. The voltage generator of claim 14, wherein the circuitry further comprises:
a fourth transistor coupled to the second input of the second amplifier, wherein the fourth transistor is configured to receive a bias at its gate to turn the fourth transistor on; and
a fifth transistor coupled to the second input of the second amplifier, wherein the fifth transistor is configured to receive an initial high threshold voltage at its gate, and wherein current through the fifth transistor is configured to vary responsive to changes in current through the third transistor and feedback resistor.

16. The voltage generator of claim 15, further comprising circuitry configured to generate the feedback voltage comprising:
a sixth transistor coupled to the first input of the first amplifier, wherein the sixth transistor is configured to receive the voltage at the output node and generate the feedback voltage at a source or drain of the sixth transistor.

17. A voltage generator comprising:
a first transistor coupled between a first supply and an output node;
a second transistor coupled between a second supply and the output node;
a first amplifier having an output coupled to a gate of the first transistor, a first input configured to receive a feedback voltage based, at least in part, on a voltage at the output node, and a second input configured to receive a low threshold voltage, wherein the first amplifier is configured to turn on the first transistor when the feedback voltage is lower than the low threshold voltage;
a second amplifier having an output coupled to a gate of the second transistor, a first input configured to receive a feedback voltage based, at least in part, on the voltage at the output node, and a second input configured to receive a high threshold voltage, wherein the second amplifier is configured to turn on the second transistor when the feedback voltage is higher than the high threshold voltage;
a third transistor having a gate coupled to the output of the second amplifier and the gate of the second transistor, wherein the second amplifier is further configured to turn on the third transistor when the feedback voltage is higher than the high threshold voltage; and
wherein the first amplifier comprises a folded cascade amplifier including:
a differential pair of transistors including a fourth and fifth transistor, wherein the fourth transistor is configured to receive the feedback voltage at a gate of the fourth transistor, and wherein the fifth transistor is configured to receive the low threshold voltage at a gate of the fifth transistor;
a cascade stage coupled to the differential pair of transistors and the gate of the first transistor; and
a feedback resistor coupled to the differential pair of transistors and the third transistor, wherein the feedback resistor and third transistor are configured to reduce an amount of current in the cascade stage during a time when the second transistor is turned on.

18. The voltage generator of claim 17, wherein the third transistor has a smaller dimension than the second transistor.

19. The voltage generator of claim 17, wherein the feedback resistor is sufficiently large to provide stable operation of the folded cascade amplifier.

20. The voltage generator of claim 17, wherein the fourth transistor is configured to provide current to the cascade stage.

21. The voltage generator of claim 17, wherein the cascade stage includes a sixth transistor having a drain coupled to the gate of the first transistor, and wherein an increase in current through the feedback resistor is configured to increase a voltage at the drain of the sixth transistor.

* * * * *

UNITED STATES PATENT AND TRADEMARK OFFICE
CERTIFICATE OF CORRECTION

| | |
|---|---|
| PATENT NO. | : 8,716,897 B2 |
| APPLICATION NO. | : 13/017960 |
| DATED | : May 6, 2014 |
| INVENTOR(S) | : Dong Pan |

It is certified that error appears in the above-identified patent and that said Letters Patent is hereby corrected as shown below:

In the Claims

In column 9, line 11, in Claim 11, delete "last" and insert -- least --, therefor.

Signed and Sealed this
Nineteenth Day of August, 2014

Michelle K. Lee
*Deputy Director of the United States Patent and Trademark Office*